United States Patent [19]
Fox, Jr. et al.

[11] Patent Number: 5,160,269

[45] Date of Patent: Nov. 3, 1992

[54] HYDROSTATIC CONNECTOR FOR FLEX CIRCUITS

[75] Inventors: Roy W. Fox, Jr., Williston, Vt.; Scott S. Corbett, III, Portland, Oreg.; David F. Miller, Aloha, Oreg.; Laurence A. Daane, Sherwood, Oreg.

[73] Assignee: Precision Interconnect Corporation, Portland, Oreg.

[21] Appl. No.: 813,288

[22] Filed: Dec. 19, 1991

[51] Int. Cl.$^5$ .............................................. H01R 9/09
[52] U.S. Cl. ..................................... 439/67; 439/197
[58] Field of Search ...................... 439/65, 67, 55, 190, 439/197, 198, 492, 493, 495, 499, 592, 593, 329, 632; 174/35 GC, 47

[56] References Cited

U.S. PATENT DOCUMENTS

| | | | |
|---|---|---|---|
| 3,076,166 | 1/1963 | Raddin | 439/197 |
| 3,090,026 | 5/1963 | Raddin | 439/197 |
| 3,569,905 | 3/1971 | Kehag-loglou | 439/197 |
| 4,538,865 | 9/1985 | Wakabayashi et al. | 439/66 |
| 4,968,265 | 11/1990 | Fox, Jr. | 439/197 |
| 5,002,496 | 3/1991 | Fox, Jr. | 439/197 |
| 5,071,357 | 12/1991 | Van Brunt, Jr. et al. | 439/197 X |

OTHER PUBLICATIONS

IBM Bulletin, vol. 8 No. 4, Sep. 1965, P. E. Stuckert, Transmission Line Connector.

*Primary Examiner*—Neil Abrams
*Assistant Examiner*—Khiem Nguyen
*Attorney, Agent, or Firm*—Chernoff, Vilhauer, McClung & Stenzel

[57] ABSTRACT

A connector system for interconnecting single or multiple pairs of flex circuits. A single pair of clamping bodies interconnects the respective ones of multiple pairs of electrical conductors in the form of conductor traces carried on respective pairs of flexible substrates, by pressing the flex circuits together between slender fluid-filled flexible bladders held in channels defined in the confronting sides of the clamping bodies. Alignment pins keep the flex circuits and clamping bodies aligned properly with each other, and alignment portions of the flex circuits correspond in thickness to that of the electrically interconnecting portions, to keep the flex circuits and clamping bodies parallel with each other. The clamping bodies are urged toward one another by clamping screws.

20 Claims, 5 Drawing Sheets

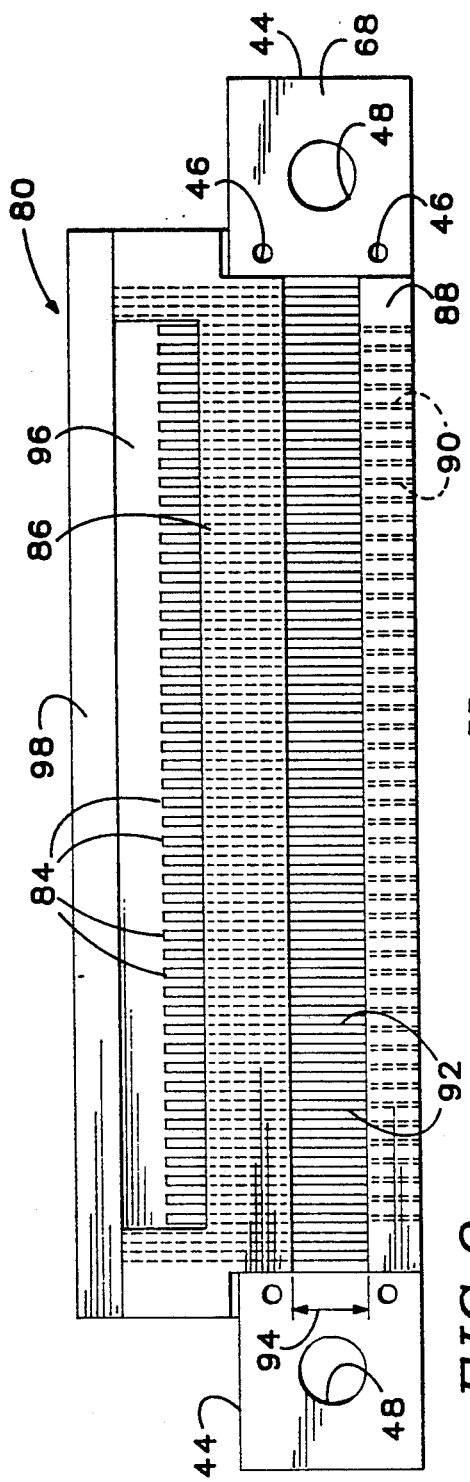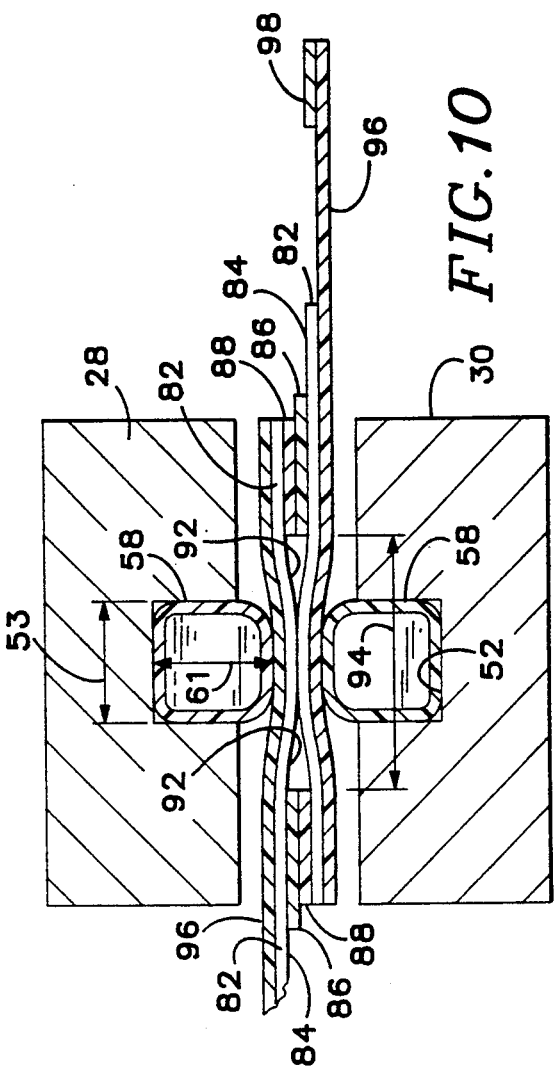

HYDROSTATIC CONNECTOR FOR FLEX CIRCUITS

BACKGROUND OF THE INVENTION

The present invention relates to high density electrical connectors, and particularly relates to a connector system for use with one or more pairs of flex circuits.

Flex circuits are well known as a way of extending multiple parallel electrical conductors. Generally, they include a flexible substrate of a dielectric material such as a polyimide resin on which are located small, closely-spaced conductor traces, useful, for example, for interconnecting circuit boards to one another, or for connecting circuit boards to flexible cables of different types. In order to provide a reliable electrical connection between flex circuits it is important to press together corresponding conductor traces of mating flex circuits with sufficent pressure to exclude gas which might corrode the material of the conductor traces in the area of contact. Interconnection of a mating pair of flex circuits has been accomplished previously by the use of resiliently compressible solid bodies, such as rubber strips located between clamping bodies, to press mating conductor traces together despite irregularities in thickness of the flex circuits in the area of interconnection, as shown, for example, by Martellotti U.S. Pat. No. 4,971,575. The performance of a solid compressible member has been found to be somewhat less than desired, however, since it does not result in equal distribution of pressure. Additionally, many elastomers will creep with time and thus lose compressive force and become ineffective. Pairs of conductor traces which are pressed together with a smaller amount of pressure in use of such previously-known devices may not achieve satisfactory electrical contact or may be subject to early deterioration of contact surfaces as a result of the ability of corrosive components of the atmosphere to reach such surfaces.

Additionally, because of the perceived need to apply adequate pressure to hold together each pair of corresponding conductor traces of a pair of flex circuits being interconnected with each other, a separate pair of clamping bodies has been considered to be necessary for each junction between a pair of flex circuits.

It has been known in the past to use flex circuits to make electrical connection to printed circuit boards to connect such circuit boards electrically into larger electronic devices, and to attach them mechanically. Fox, Jr. U.S. Pat. No. 4,968,265, and Fox, Jr. U.S. Pat. No. 5,002,496 disclose the use of a fluid-filled bladder interacting between a backing member and a flex circuit to transmit fluid pressure to connect a flex circuit to a circuit board.

An IBM Technical Disclosure Bulletin, Vol. 8, No. 4, pp. 518-519, dated September 1965, by P. E. Stuckert, discloses a transmission line connector utilizing a pair of expansible metallic bladders which may be inflated by pressurized fluid to urge mating surfaces together to provide electrical contact.

Wakabayashi et al. U.S. Pat. No. 4,538,865 discloses use of a connector to mate a single pair of printed circuit boards by using an elastic member to provide compliant pressure against one of the pair of mated circuits aligned with one another by screws passing through holes defined in the printed circuit boards.

None of the prior art known to the inventors hereof, however, has provided a connector capable of interconnecting multiple superimposed pairs of flex circuits at a single connector, between a single pair of clamping bodies.

In some applications, such as certain medical diagnostic equipment, it is necessary to provide reliable interconnection, between flexible cables having hundreds of individual electrical conductors and associated portable sensor bodies, or between such cables and circuits of stationary electronics equipment. Particularly with respect to such a movable sensor head attached to such a flexible cable, it is often desirable to minimize the size of the sensor head. Accordingly, it is desired to provide connection between the flexible cable and such a portable sensor through as small a connector as is practical.

What is desired, then, is an improved connector for interconnecting multiple pairs of multi-conductor flex circuits at a single location and with a minimum amount of space being occupied by a connector assembly or assemblies, in order to provide increased density of electrical interconnection of pairs of conductors.

SUMMARY OF THE INVENTION

The present invention provides a connector for interconnecting one or more pairs of flex circuits at a single location, with a high effective density of interconnection of pairs of electrical conductors. This is accomplished by using a single pair of clamping bodies to hold together at least one and preferably several pairs of flex circuits, with mating end portions of the flex circuits of each pair being held aligned with each other, so that corresponding electrical circuit conductor traces of the mating flex circuits are held precisely aligned with one another.

The substrate material is flexible and generally planar with a uniform small thickness. Preferably, all of the several electrical conductor traces on the substrate are manufactured in the same manner and thickness, in order to provide regularity and uniformity facilitating the creation of satisfactory electrical contact between the surfaces of each mating pair of conductor traces.

Each clamping body defines a groove or channel housing a narrow flexible bladder filled with a fluid, with the channels and fluid-filled bladders facing toward each other and with the interconnected flex circuits between the clamping bodies. Preferably, the bladders are filled with a substantially incompressible fluid, so that the force holding together the two clamping bodies is distributed and applied evenly to the flex circuits by the bladders, to urge together the corresponding ones of each of the many pairs of electrical conductor traces being interconnected. The force holding together the clamping bodies may be generated, for example, by clamping screws interconnecting them.

An alignment device holds each flex circuit in accordance with the invention in alignment with the flex circuit to which it is interconnected electrically. For example, alignment pins may be mounted in one or both of the clamping bodies to extend through alignment pin holes located precisely in each of the flex circuits. In one preferred embodiment of the apparatus of the invention, the clamping bodies also define sockets for receiving such alignment pins, so that the two clamping bodies are also kept aligned with each other, thus keeping the fluid-filled bladders located opposite and parallel with each other.

Since the electrical conductor traces each have a definite thickness, the thickness of the substrate of each flex circuit is less than the combined thickness of substrate and conductor trace. The flexibility of the bladders carried on the inner sides of the opposing clamping members accommodates this difference in thicknesses and the bladders continue to apply pressure holding the individual electrical conductor traces in contact with each other, despite flexure of the substrate resulting from pressure exerted by the clamping bodies through the fluid-filled bladders.

Preferably, when multiple pairs of flex circuits are interconnected using a connector according to the invention, the mating portions of the flex circuits of all of the pairs will be of similar design. The portions of the individual conductor traces between the bladders will thus be aligned with one another, not only as between the ones of a particular pair, but also among all of the flex circuits of several pairs being interconnected at the same connector assembly.

Each flex circuit of each pair preferably includes a flexible substrate with individual electrical circuit conductors located thereon to correspond with the locations of mating electrical circuit conductors of the other flex circuit of the particular pair being interconnected. Each flex circuit also, preferably, includes alignment portions, such as an area near each of the opposite lateral margins of the flex circuit, in which a spacer layer of material equal in thickness to that of the electrical circuit conductor traces is located. This stabilizes the position of each flex circuit with respect to the other one of each pair, and also stabilizes multiple pairs of flex circuits with respect to one another when multiple pairs of flex circuits are stacked upon one another between the two clamping bodies of the connector. The spacer layer also eliminates a gap into which the bladder could be extruded, thus helping to maintain equal force on all pairs of conductor traces. Preferably, the alignment pin holes of each flex circuit are defined in the alignment portion of the flex circuit.

In a preferred embodiment of the invention, each alignment portion of each flex circuit may include a stabilizing area of the substrate covered with a spacer layer of the same material, applied in the same thickness and manner, as is used to form the individual electrical conductor traces of the flex circuit. The alignment sections of the flex circuits in a preferred embodiment of the invention thus have the same thickness as the combined thickness of the substrate and each of the individual electrical conductor traces.

It is therefore a principal object of the present invention to provide a connector for reliably interconnecting a pair of flex circuits each including multiple electrical conductors.

It is another important object of the present invention to provide a connector assembly by which multiple pairs of flex circuits can be reliably interconnected simultaneously.

It is an important feature of a connector according to the present invention that it includes a pair of parallel clamping bodies each defining a channel holding a flexible fluid-filled bladder extending above the surface of the clamping body where the channel is located.

It is another important feature of the present invention that the clamping bodies include alignment devices for holding a plurality of flex circuits in precisely defined locations with respect to the clamping bodies.

It is another feature of the present invention that each of the flex circuits being interconnected includes a stabilizing portion having a predetermined thickness, to assist in keeping several flex circuits located parallel with one another while they are held clamped together by the clamping bodies of the connector assembly according to the invention.

It is an important advantage of the present invention that it provides a connector assembly for interconnecting the ones of several pairs of multiconductor flex circuits accurately and reliably and in a minimum amount of space, since a single connector can replace several connectors each interconnecting a single pair of flex circuit elements.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 9 is a top plan view of a flex circuit intended for use in a connector assembly according to the present invention.

FIG. 10 is a section view of a connector assembly according to the present invention including the flex circuit shown in FIG. 9.

DETAILED DESCRIPTION OF THE INVENTION

Figure 1:
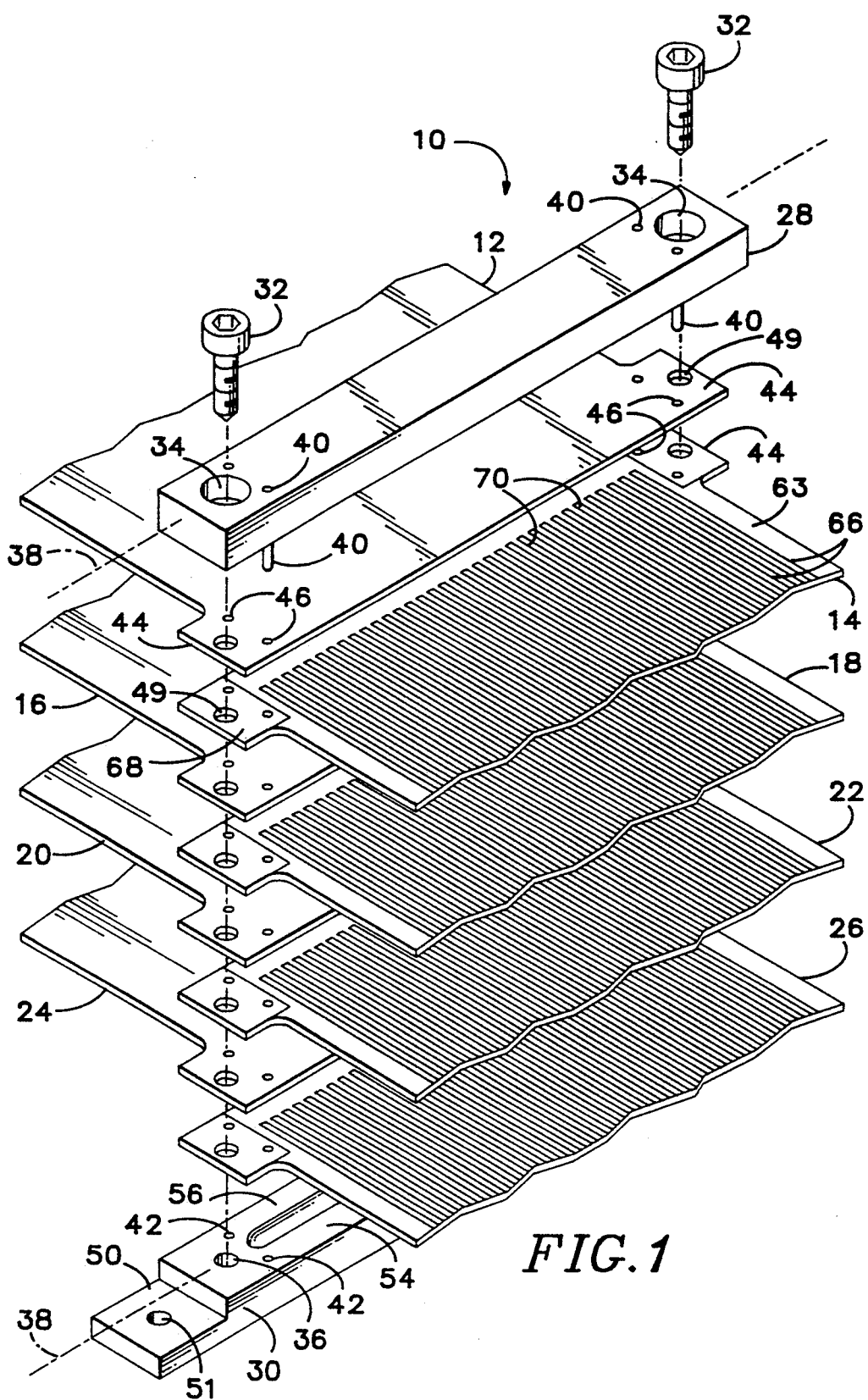
FIG. 1 is an exploded perspective view of a flex circuit connector assembly according to the present invention, including four pairs of flex circuits to be interconnected.

Referring now particularly to FIG. 1 of the drawings, a flex circuit connector assembly 10, shown in an exploded view, electrically interconnects pairs of corresponding flex circuits 12 and 14, 16 and 18, 20 and 22, and 24 and 26, holding respective interconnecting end portions of each of the flex circuits between a pair of clamping bodies 28 and 30. A pair of clamping screws 32 extend through respective bores 34 defined in the upper clamping body 28 and are received in corresponding threaded bores 36 provided in the lower clamping body 30.

Figure 2:
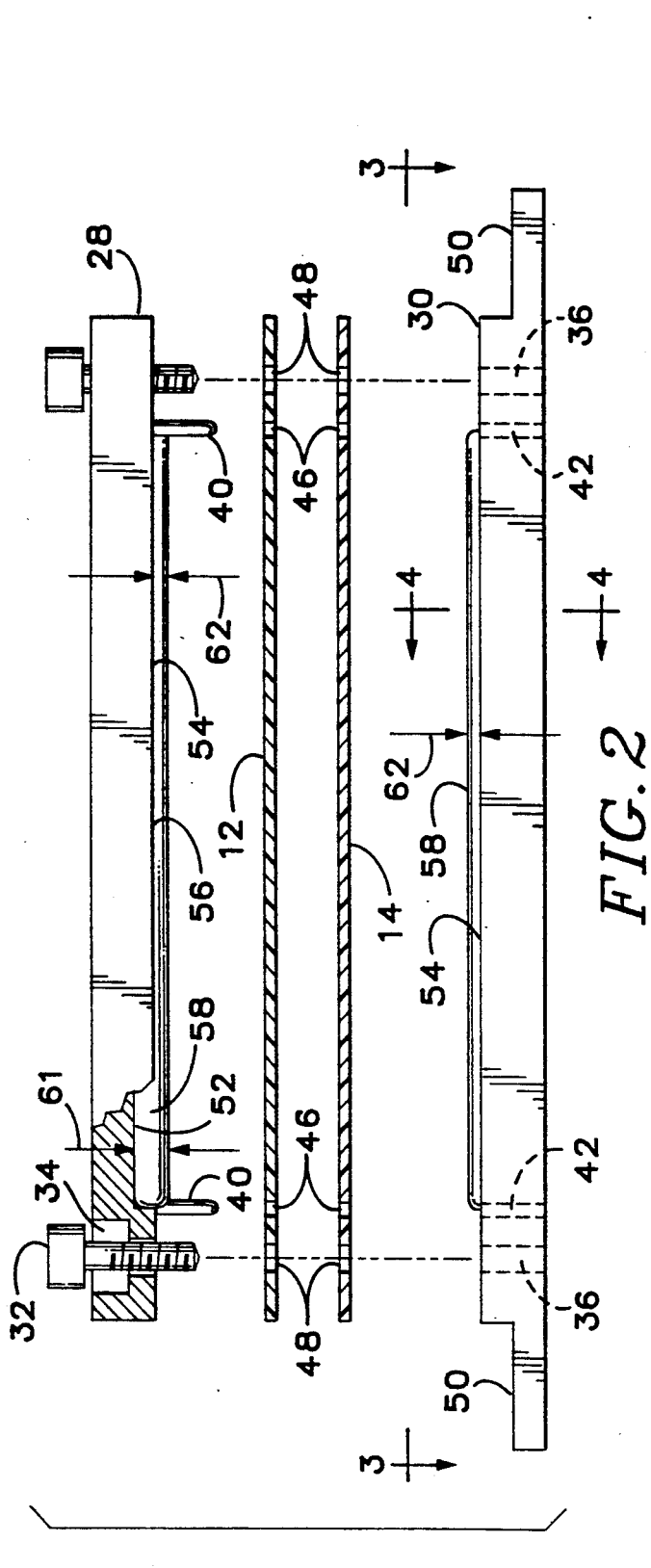
FIG. 2 is a partially cut-away exploded elevational view of the connector assembly shown in FIG. 1, including a single pair of flex circuits to be interconnected thereby.
Figure 3:
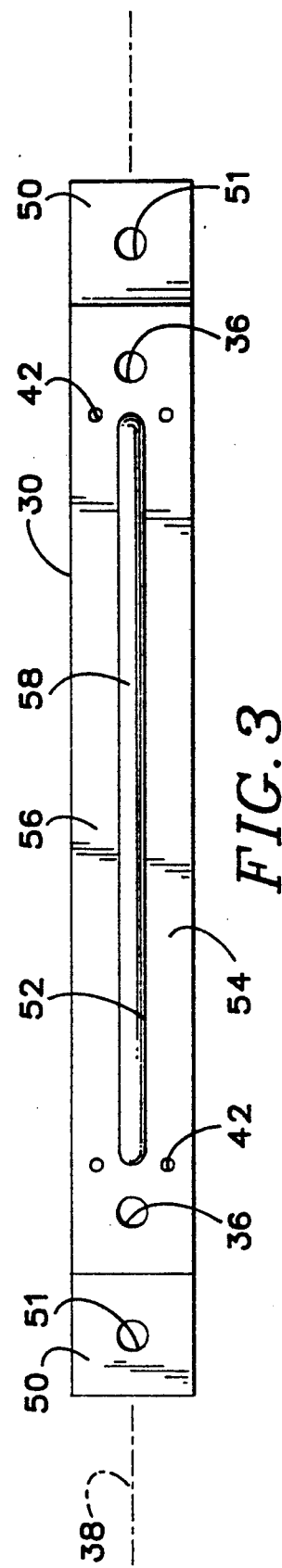
FIG. 3 is a view of the inner side of one of the clamping bodies of the flex circuit connector according to the present invention, taken along line 3—3 of FIG. 2.

As shown better in FIG. 2, each of the bores 34 is large enough to receive the head of the respective clamping screw 32 in a countersunk position, and includes a ledge 35 against which the head of the screw 32 can bear to urge the upper clamping body 28 toward the lower clamping body 30 when the screws 32 are tightened in the threaded bores 36. The clamping bodies 28 and 30 may be of a suitably strong material such as aluminum or another metal. They are generally rectangular, each defining a respective longitudinal axis 38, and the clamping screws 32 and the clamping screw bores 34 and 36 are located near the opposite ends of the clamping bodies 28 and 30.

Also located near each end of the clamping body 28 are a pair of alignment pins 40, which may be of stainless steel and may be press fitted in appropriately located bores or otherwise permanently mounted on the clamping body 28. Respective alignment pin receiving bores 42 are provided in the clamping body 30 to receive each of the alignment pins 40. For example, the diameter of the alignment pin receiving bores 42 and the alignment pin holes 46 may be greater than the diameter of the alignment pins 40 by one to two-thousandths of an inch (25-50 microns). Preferably, all of the alignment pins are parallel with each other.

Each of the flex circuits 12, 14, 16, 18, 20, 22, 24, and 26 includes a respective pair of alignment portions 44 having the form of ears extending laterally with respect to each of the aforementioned flex circuits. It is not critical that the alignment portions 44 extend wider than the width of more remote portions of the flex circuits, but it is desirable for the alignment portions 44 to be located at or near the lateral margins of each flex circuit.

Each of the alignment portions 44 defines a pair of respective alignment pin holes 46 to receive respective ones of the alignment pins 40. Preferably, the alignment pin receiving bores 42 in the clamping body 30 and the alignment pin holes 46 in each of the flex circuits are all formed and located precisely to receive the alignment pins 40 and hold each of the flex circuits 12, 14, 16, 18, 20, 22, 24, and 26, and the lower clamping body 30 aligned properly with the clamping body 28 as the clamping body 28 is drawn toward the clamping body 30 by tightening the clamping screws 32.

Each of the flex circuits 12, 14, 16, 18, 20, 22, 24, and 26 also defines a pair of clamping screw holes 48, defined in the alignment portions 44 of each flex circuit. Like the bores 34, the clamping screw holes 48 are large enough to permit the clamping screws 32 to pass therethrough without interfering with the function of the alignment pins 40 mated with alignment pin receiving bores 42 and extending through alignment pin holes 46.

An extension 50 may be provided on each end of the lower clamping body 30, as shown. A hole 51 is defined in the extension 50 to facilitate mounting the clamping body 30 on a supporting surface.

Figure 4:
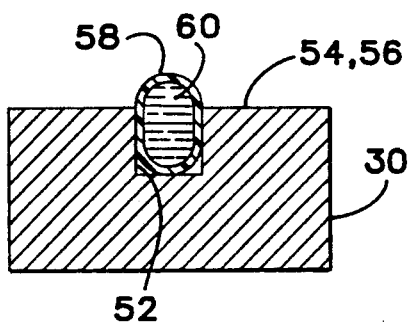
FIG. 4 is a sectional view, at an enlarged scale, of the clamping body shown in FIG. 3, taken along line 4—4 of FIG. 2.

A channel 52 having a width 53 is defined in the inner side 54 of each of the clamping bodies 28 and 30, and a planar inner surface 56 surrounds each channel 52. A respective elongate slender bladder 58 substantially fills each channel 52 and extends protuberantly above the inner surface 56 of each of the clamping bodies 28 and 30, as may be seen most clearly in FIGS. 2 and 4. The channels 52 and the bladders 58 extend longitudinally of the respective clamping bodies 28 and 30, generally parallel with the longitudinal axis 38 of each. Each of the bladders 58 is thin-walled, made of a strong flexible material, and is filled with a substantially incompressible fluid 60. The bladder 58 has, preferably, a regular cross-section shape so that it protrudes above the upper surface 56 of each of the clamping bodies 28 and 30 by a height 62 which is uniform along the length of the bladder 52. The size and shape of each of the channels 52 are uniform over the length of each channel. For example, the bladder may be of a material such as that available from Dow Corning, of Midland, Mich., as its type 2355-80AE material, under the trademark Pellethane, having a wall thickness of about 0.010 inch, and a diameter 61 of about 0.050 inch. The material of the bladder 58 is thus flexible, yet strong enough to withstand a significant pressure within the bladder without bursting and without stretching significantly.

Figure 5:
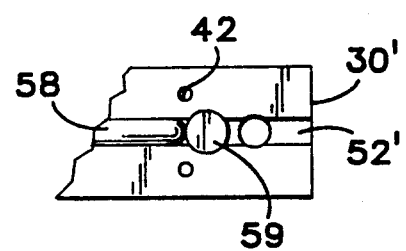
FIG. 5 is a detail view, similar to that of FIG. 3, showing a portion of a clamping body of a connector assembly which is a different embodiment of the invention.

As a possible alternative to the clamping body 30, a clamping body 30' shown in FIG. 5 is generally similar to the clamping body 30, except that, for ease of machining, the channel 52' extends the full length of the clamping body 30', and a plug 59, which may be of a suitably strong and hard plastic material such as a UV cured potting material, is provided in a cavity formed as an enlargement of a portion of the channel 52'. The plug 59 acts as an end of the portion of the channel 52' holding the bladder 58. The clamping body 30' and a mating clamping body (not shown) having the same construction function identically to the clamping bodies 28 and 30 shown in FIGS. 1-4.

All of the flex circuits 12, 14, 16, 18, 20, 22, 24, and 26 are preferably essentially similar in the vicinity of the connector assembly 10, although at any distance from the clamping bodies 28 and 30 the configuration of the flex circuits is of little concern. Each flex circuit has a substrate 63 of a flexible dielectric material such as a polyimide resin having a thickness 64, which may be 0.002 inches (51 microns). One such polyimide material is available from E.I. DuPont de Nemours & Co., Inc. of Wilmington, Del., and is well known by its trademark Kapton.

A plurality of parallel conductor traces 66 are provided on the substrate 63, as by being adhesively attached in the form of a sheet of copper, from which parts are selectively removed by conventional techniques used in the production of flex circuits. Each alignment portion 44 of each flex circuit such as the flex circuit 12 also includes a spacer laminate 68 of similar or like material also adhesively attached to the substrate 63.

Each of the conductor traces 66 is located precisely with respect to the substrate 63 and particularly with respect to the alignment pin holes 46. The locations of the conductor traces 66 also correspond matingly with the locations of corresponding ones of the conductor traces 66 in a mating one of a pair of flex circuits to be interconnected with each other, such as the flex circuits 12 and 14. Thus, when the flex circuits 12 and 14 are arranged as shown in FIG. 1, with the conductor traces 66 of the flex circuit 12 facing toward the conductor traces 66 of the flex circuit 14, and with both the flex circuit 12 and the flex circuit 14 having the alignment pins 40 extending through respective ones of the alignment pin holes 46, each of the conductor traces 66 is aligned with a corresponding conductor trace 66 on the opposite one of the flex circuits of the pair.

The flex circuits 12 and 14, and the other mating pairs of flex circuits, are placed carefully on one of the clamping bodies, with the alignment pins in the respective alignment pin holes. Then the clamping screws 22 are tightened to draw the clamping bodies 28, 30 together.

Figure 6:
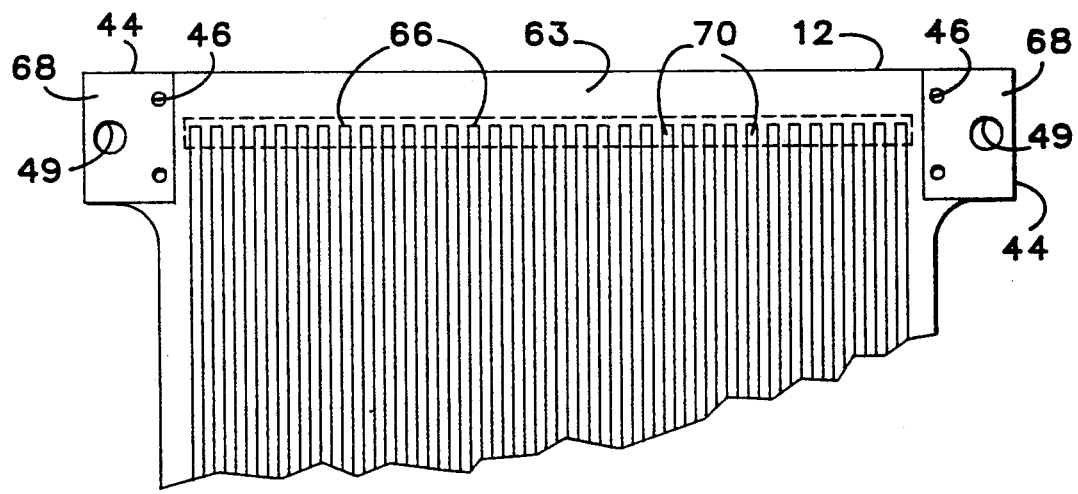
FIG. 6 is a plan view of an end portion of a flex circuit of a type adapted to be interconnected by the flex circuit connector shown in FIG. 1.
Figure 7:
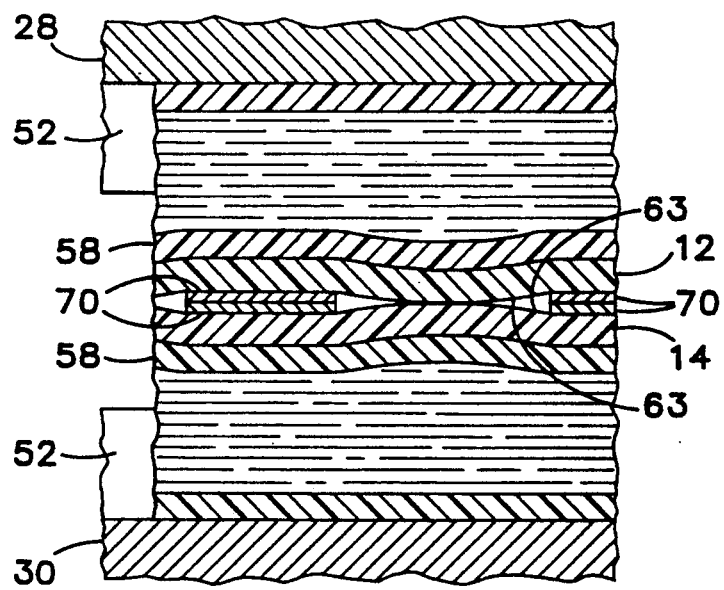
FIG. 7 is a sectional view, at a greatly enlarged scale, of a detail of the flex circuit connector shown in FIG. 1 with a single pair of flex circuits interconnected thereby, taken along the line 7—7 in FIG. 1.

Hydraulic pressure is developed within the bladders 58 as a result of tension in the clamping screws 32 while the bladders 58 are in contact with flex circuits held between the clamping bodies 28 and 30. This pressure is distributed over all of the surfaces of the flex circuits with which the bladder is in contact. As a result, the bladders 58 conform to the flex circuit surfaces to compensate for small irregularities between the thicknesses of different ones of the conductor traces 66, and ample pressure holds opposed ones of the conductor traces 66 in intimate physical and electrical contact with each other. The force generated by tightening the clamping screws 32 is thus distributed evenly over a small area corresponding to the contact area between the surfaces of the bladders 58 and the adjacent substrates of the flex circuits being interconnected by the apparatus 10 of the present invention. As indicated in FIG. 7, the pressure within the bladders 58 is thus applied to press together the conductor trace contact portions 70, which are located within an area delineated by a broken line in FIG. 6.

Figure 8:
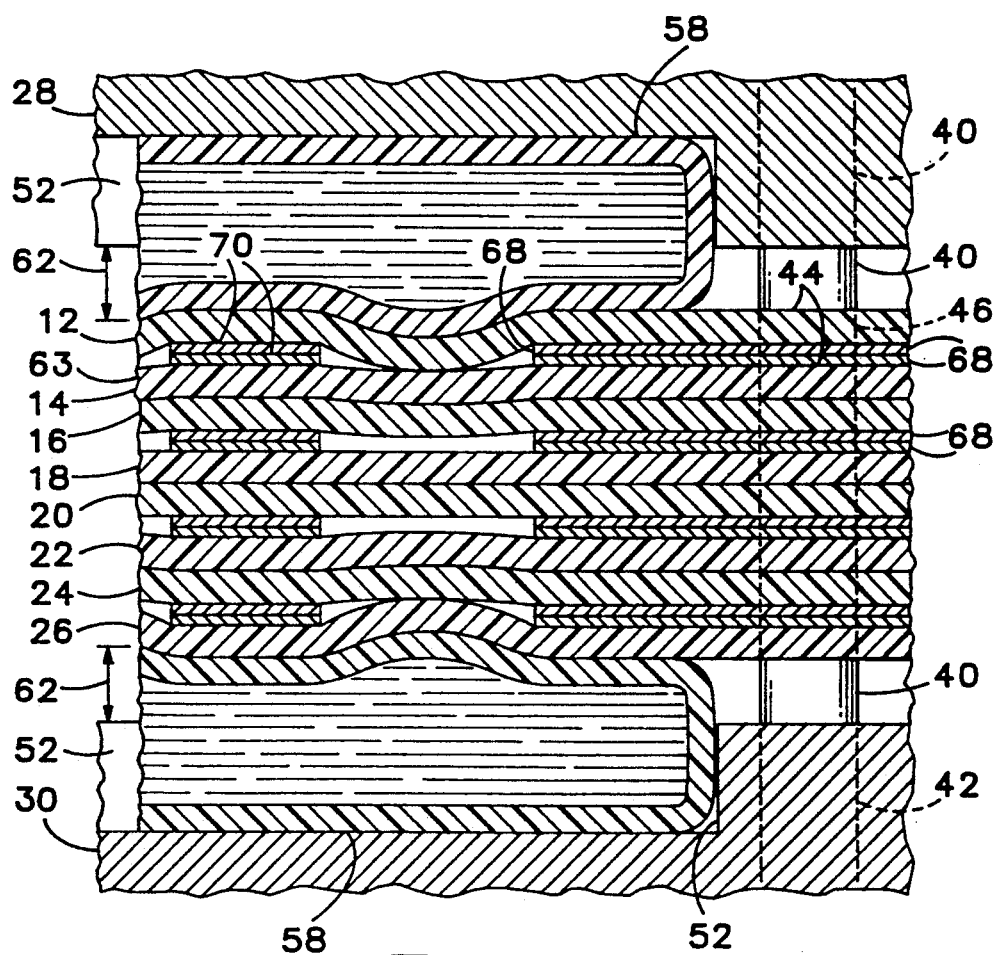
FIG. 8 is a detail view, at a greatly enlarged scale, showing four pairs of flex circuits interconnected by the flex circuit connector of the present invention, taken along the line 8—8 of FIG. 1.

In order to enhance the stability of alignment among and transmission of pressure through multiple pairs of flex circuits to be interconnected thus, as may be seen best in FIG. 8, each of the spacer layers 68 in each of the alignment portions 44 has a thickness 72 substantially the same as the thickness 74 of each of the conductor traces 66. For example, the thicknesses 72 and 74 may be about 0.001 inch. In a preferred embodiment of the invention, at least in a contact area 70 of each conductor trace 66 and in the spacer layer areas 68, the thicknesses 72 and 74 may be made up of a combination of layers (not shown in the drawings), consisting of a base layer of copper connected to the substrate 62 by an adhesive, covered by an electroplated intermediate layer of nickel, and further covered by an electroplated surface layer of gold, with the thicknesses of the deposits of nickel and gold together being less than the thickness of the copper by two orders of magnitude. Thus the thickness of each spacer deposit layer 68 is substantially the same as the thickness of each conductor trace, regardless of whether the surface platings are applied to the spacer layers 68. The alignment portions 44 are located near the ends of the clamping bodies 28 and 30 and also near or surrounding the clamping screws 32. As a result, the accumulated thicknesses of the spacer layers 68 and the substrate 62, being similar to the thicknesses of the accumulated substrates 62 and conductor trace contact areas 70 being electrically interconnected, prevent the clamping bodies 28 and 30 from becoming significantly skewed from parallelism with each other as a result of unequal tightening of the clamping screws 32. At the same time, the bladders 58 maintain pressure across all of the conductor traces 66 being interconnected by use of the connector assembly 10 of the invention. Thus, not only are the mating ones of each pair of flex circuits held precisely aligned with one another in their respective planes parallel with the inner surfaces 56 of the inner sides 54, by the alignment pins 40 passing through the alignment pin holes 46 in each flex circuit of a pair being interconnected, but several stacked pairs of flex circuits being interconnected are kept substantially parallel with each other, with their corresponding conductor traces held together in intimate electrically connecting contact, at least in the contact areas 70 aligned with the bladders 58.

Referring now also to FIGS. 9 and 10, a flex circuit 80 is intended specifically for use as a short-coupled interconnection element between, for example, a multi-conductor cable and a printed circuit, or a sensor array terminated to another flex circuit of similar type to which the cable is to be electrically connected by use of the connector assembly 10. The flex circuit 80 includes a plurality of short conductor traces 82 each including a small solder connection terminal portion 84. A cover layer 86 of an electrically insulating resin such as polyimide is deposited atop the group of conductor traces, and a similar cover layer 88 of such resin is attached, also by an adhesive, to cover the narrow extensions 90 of the conductor traces, normally used merely during the process of electro-plating the conductor traces 82. Respective short portions 92 of the conductor traces 82 are left exposed in a central contact area of the flex circuit where pressure is applied by the bladders 58 to interconnect corresponding contact areas of the conductor traces of a mating pair of such short flex circuits. The contact area portion 92 of each conductor trace 82 preferably has a length 94 at least twice as long as the width 53 of the channel 52 and bladder 58, to assure sufficient flexibility in that portion of the short flex circuit 80 for proper contact to be made between mating contact area portions 92 of the conductor traces 82. A coaxial bus strip 98 is connected to some of the conductor traces 82.

The cover layer 86 acts as a solder dam to keep solder out of the contact area of the flex circuit. The cover layers 86 and 88 also prevent the adhesively attached individual short conductor traces from becoming separated from the polyimide substrate 96. In the case of such a flex circuit 80 where, for reasons which do not have any particular significance to the present invention, the conductor traces 82 diverge from one another near the contact area, such a cover layer 86 or 88 may also prevent undesired electrical contact between certain of the conductor traces 82 on opposite ones of a pair of flex circuits being interconnected by the connector assembly 10 of the invention. It will be readily apparent that the cover layer 86 or 88, however, should be no thicker than is necessary to provide the required degree of insulation or opposition to the flow of excess solder along the individual conductor traces, in order not to interfere with the ability of the bladders 58 to keep the mating conductor trace contact portions 92 reliably in electrical contact with one another, especially when multiple pairs of flex circuits are stacked for simultaneous interconnection.

The flex circuit 80 also includes alignment portions 44 defining alignment pin holes 46 and clamping screw holes whose location and function correspond with those of the corresponding parts of the flex circuits shown in FIGS. 1-4 and 5-8. Similarly, the alignment portions 44 of the flex circuit 80 also includes spacer layers 68 corresponding in thickness to that of the conductor traces 82.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. Apparatus for interconnecting respective pluralities of electrical conductors, comprising:
    (a) at least one pair of conductor-carrying elements, each said conductor-carrying element including a respective flexible substrate and a respective plurality of conductor traces located spaced apart from each other thereon;
    (b) first and second clamping bodies, each having a respective inner side and each defining a respective channel located on said inner side, each inner side having a respective inner surface located adjacent said channel;
    (c) a respective flexible, fluid-filled bladder located in each of said channels and supported therein with a part of each said bladder being protuberant above the respective inner surface located adjacent thereto;
    (d) means for urging said first and second clamping bodies toward one another in a mating relationship with said inner sides thereof facing toward each other with said conductor-carrying elements held therebetween;
    (e) alignment means located between said first and second clamping bodies, for holding all of said conductor-carrying elements in respective predetermined positions relative to one of said first and second clamping bodies, and for holding both conductor-carrying elements of each pair so that corresponding ones of said conductor traces are in confronting registration with each other;
    (f) said conductor-carrying elements having a combined thickness of said substrate and said conductor traces; and
    (g) said alignment means including an alignment portion included in each of said conductor-carrying elements, said alignment portion having a thickness equal to said combined thickness of substrate and said conductor traces.

2. The apparatus of claim 1 wherein each of said clamping bodies has a longitudinal axis and the respective channel defined in each of said clamping bodies extends parallel with said longitudinal axis, and wherein said conductor traces of said conductor-carrying elements held between said clamping bodies extend transversely with respect to said channels.

3. The apparatus of claim 2 wherein each said conductor-carrying element has a width extending parallel with said longitudinal axis and wherein said conductor traces of all of said conductor-carrying elements are correspondingly located, spaced apart from one another along said width of each conductor-carrying element.

4. The apparatus of claim 1 including second alignment means included in at least one of said clamping bodies for maintaining a predetermined relationship between said respective inner surfaces of said first and second clamping bodies, said second alignment means including a pin extending from one of said first and second clamping bodies through an alignment hole defined in each of said conductor-carrying elements and into a socket defined in the other of said first and second clamping bodies.

5. The apparatus of claim 4 wherein said first and second clamping bodies each have a pair of opposite ends and a respective one of said pins and sockets is located proximate each of said opposite ends of said first and second clamping bodies, and wherein said alignment means and said second alignment means cooperate with each other.

6. The apparatus of claim 1 wherein each said bladder is filled with an incompressible fluid and each said channel prevents expansion of the respective bladder located therein except toward said contact-carrying elements.

7. The apparatus of claim 1 wherein each of said first and second clamping bodies has a pair of opposite ends, and each of said conductor-carrying elements has a pair of said alignment portions, a respective one of each pair of said alignment portions being located adjacent each of said opposite ends of said clamping bodies and extending across said channels and bladders, each of said alignment portions having a thickness equal to the combined thickness of the respective substrate and a respective conductor trace of the respective conductor-carrying element.

8. The apparatus of claim 1 wherein each of said conductor-carrying elements includes a like plurality of said conductor traces, correspondingly located on each of said conductor-carrying elements so that each conductor trace on any of said conductor-carrying elements is aligned with a respective conductor trace on each other one of said conductor-carrying elements.

9. The apparatus of claim 1 wherein each of said conductor-carrying elements defines a respective alignment hole located so as to receive each of said alignment pins and keep said conductor-carrying elements aligned with each other in respective planes parallel with said inner sides of said clamping bodies.

10. The apparatus of claim 1 wherein one of said flex circuits includes a layer of dielectric material covering a respective portion of each of a plurality of said conductor traces adjacent the respective portions of said conductor traces which are in contact with corresponding conductor traces of a mating flex circuit, so as to obstruct flow of solder along each of said conductor traces.

11. Apparatus for interconnecting respective pluralities of electrical conductors, comprising:
    (a) a plurality of pairs of conductor-carrying elements, each conductor-carrying element of each pair having a respective flexible substrate and a respective plurality of conductor contact traces located spaced apart from one another thereon, a portion of each of said conductor contact traces on each conductor-carrying element confronting a corresponding portion of a conductor contact trace on the other conductor-carrying element of a respective pair, the substrate and conductor contact traces of each said conductor-carrying element having a combined thickness;
    (b) mating first and second clamping bodies, each having a respective inner side and defining a respective channel located on said inner side thereof and having a respective inner surface located adjacent said channel;
    (c) hydrostatic pressure distributing means located in each of said channels and supported therein with a part thereof protuberant above the respective inner surface located adjacent to the respective channel, for applying pressure to said conductor-carrying elements and urging said conductor contact traces of each said conductor-carrying element into electrical contact with corresponding conductor contact traces of the opposite conductor-carrying element of the respective pair;
    (d) means for urging said first and second clamping bodies toward one another with said inner sides thereof facing each other and with said conductor-carrying elements held therebetween;

(e) alignment means associated with one of said clamping bodies and cooperative with the other of said clamping bodies, for holding all of said conductor-carrying elements in respective predetermined positions with respect to one another, in respective planes parallel with said inner side of one of said first and second clamping bodies, and with the conductor contact traces located on one of each pair of said conductor-carrying elements being located in confronting registration with corresponding ones of the conductor contact traces located on the other; and (f) an alignment portion, included in each of said conductor-carrying elements, located between said clamping bodies and having a thickness which combines with a thickness of a confronting portion of the other one of said conductor-carrying elements of each respective pair of conductor-carrying elements to keep respective portions of said conductor-carrying elements of each said pair parallel with each other between said clamping bodies.

12. The apparatus of claim 11 wherein the thickness of each said alignment portion of a pair of said conductor-carrying elements is equal to the combined thicknesses of the respective substrate and a respective conductor contact trace of each of the conductor-carrying elements of the respective pair.

13. The apparatus of claim 11 wherein each of said clamping bodies has a longitudinal axis and the respective channel defined in each of said clamping bodies extends parallel with said longitudinal axis, and wherein said conductor contact traces of said conductor-carrying elements held between said clamping bodies extend transversely with respect to said channels.

14. The apparatus of claim 13 wherein each said conductor-carrying element has a width extending parallel with said longitudinal axis, and wherein said conductor contact traces of all of said conductor-carrying elements are correspondingly located, spaced apart from one another along said width of each conductor-carrying element.

15. The apparatus of claim 11 wherein said alignment means includes a pin extending from one of said first and second clamping bodies through an alignment hole defined in each of said conductor-carrying elements and into a socket defined in the other of said first and second clamping bodies.

16. The apparatus of claim 15 wherein said first and second clamping bodies each have a pair of opposite ends and a respective one of said pins and sockets is located proximate each of said opposite ends of said first and second clamping bodies.

17. The apparatus of claim 11 wherein each said hydrostatic pressure distributing means includes a bladder filled with an incompressible fluid and each said channel prevents expansion of the respective bladder except toward said contact-carrying elements.

18. The apparatus of claim 11 wherein each of said first and second clamping bodies has a pair of opposite ends, and each of said conductor-carrying elements has a pair of said alignment portions, one of each pair of said alignment portions being located adjacent each of said opposite ends of said clamping bodies and extending across said channels and bladders, each of said alignment portions having a thickness equal to the combined thickness of the substrate and a respective conductor contact trace of the respective conductor-carrying element.

19. The apparatus of claim 11 wherein each conductor-carrying element of each said pair of conductor-carrying elements includes a like plurality of said conductor contact traces, correspondingly located on each of said conductor-carrying elements so that each conductor contact trace on any of said conductor-carrying elements is aligned with a respective conductor contact trace on each other one of said conductor-carrying elements.

20. The apparatus of claim 11 wherein each of said conductor-carrying elements defines a respective alignment hole located so as to receive each of said alignment pins and keep said conductor-carrying elements aligned with each other in respective planes parallel with said inner sides of said clamping bodies.

* * * * *

UNITED STATES PATENT AND TRADEMARK OFFICE
CERTIFICATE OF CORRECTION

PATENT NO. : 5,160,269

DATED : November 3, 1992

INVENTOR(S) : Roy W. Fox, Jr. et al.

It is certified that error appears in the above-identified patent and that said Letters Patent is hereby corrected as shown below:

Col. 7, line 1    Delete "screws 22" and insert --screws 32--.

Signed and Sealed this

Twenty-third Day of November, 1993

Attest:

BRUCE LEHMAN

Attesting Officer

Commissioner of Patents and Trademarks